US010090379B2

(12) United States Patent
Harada et al.

(10) Patent No.: US 10,090,379 B2
(45) Date of Patent: Oct. 2, 2018

(54) HYDROGEN OCCLUSION SEMICONDUCTOR DEVICE

(71) Applicant: FUJI ELECTRIC CO., LTD., Kanagawa (JP)

(72) Inventors: Yuichi Harada, Matsumoto (JP); Yasuyuki Hoshi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/475,144

(22) Filed: Mar. 31, 2017

(65) Prior Publication Data
US 2017/0207301 A1 Jul. 20, 2017

Related U.S. Application Data

(63) Continuation of application No. PCT/JP2016/061206, filed on Apr. 6, 2016.

(30) Foreign Application Priority Data

Apr. 20, 2015 (JP) .................................. 2015-085620
Jun. 17, 2015 (JP) .................................. 2015-122041

(51) Int. Cl.
*H01L 29/06* (2006.01)
*H01L 29/78* (2006.01)
*H01L 23/532* (2006.01)

(52) U.S. Cl.
CPC .... *H01L 29/0615* (2013.01); *H01L 23/53209* (2013.01); *H01L 23/53295* (2013.01); *H01L 29/0649* (2013.01); *H01L 29/78* (2013.01)

(58) Field of Classification Search
CPC ........... H01L 29/0615; H01L 23/53209; H01L 23/53295; H01L 29/0649; H01L 29/78
See application file for complete search history.

(56) References Cited

U.S. PATENT DOCUMENTS 5,100,615 A * 3/1992 Oguro ................... C01B 3/0031
420/417
5,712,502 A * 1/1998 Mitlehner ........... H01L 29/0615
257/341
(Continued)

FOREIGN PATENT DOCUMENTS

JP    H02-77128 A     3/1990
JP    H07-326744 A    12/1995
(Continued)

OTHER PUBLICATIONS

M. Pozzo, D. Alfe, "Hydrogen dissociation and diffusion on transition metal (=Ti, Zr, V, Fe, Ru, Co, Rh, Ni, Pd, Cu, Ag)-doped Mg(0001) surfaces", International Journal of Hydrogen Energy, vol. 34, 2009, Elsevier, pp. 1922-1930.*

(Continued)

*Primary Examiner* — William Coleman

(57) ABSTRACT

When hydrogen penetrates in to the semiconductor device, a gate voltage threshold of a gate structure (Vth) is shifted. Penetrating of hydrogen into the semiconductor device from the edge termination structure section which is positioned at an end portion of the semiconductor device is prevented. To provide a semiconductor device comprising a semiconductor substrate in which an active region and an edge termination structure section which is provided around the active region are provided, a first lower insulating film which is provided in the edge termination structure section on the semiconductor substrate, and a first protective film which is provided on the first lower insulating film, and is electrically insulated from the semiconductor substrate, and occludes hydrogen.

11 Claims, 11 Drawing Sheets

(56) References Cited

U.S. PATENT DOCUMENTS

| | | | |
|---|---|---|---|
| 5,945,692 A | 8/1999 | Yano et al. | |
| 5,951,945 A * | 9/1999 | Komada | C01B 3/0031 |
| | | | 148/426 |
| 8,093,676 B2 * | 1/2012 | Schmidt | H01L 21/26586 |
| | | | 257/168 |
| 9,570,542 B2 * | 2/2017 | Breymesser | H01L 29/0615 |
| 9,595,469 B2 * | 3/2017 | Hilsenbeck | H01L 21/76841 |
| 9,666,676 B2 * | 5/2017 | Ogino | H01L 29/1608 |
| 2002/0036346 A1 | 3/2002 | Harada | |
| 2002/0132426 A1 | 9/2002 | Shinohara et al. | |
| 2005/0101132 A1 | 5/2005 | Kim et al. | |
| 2011/0241130 A1 | 10/2011 | Chan et al. | |
| 2014/0299887 A1 | 10/2014 | Matocha et al. | |
| 2015/0115285 A1 | 4/2015 | Kinoshita et al. | |
| 2015/0243753 A1 | 8/2015 | Suekawa et al. | |
| 2016/0093748 A1 * | 3/2016 | Mieczkowski | H01L 29/0619 |
| | | | 257/77 |
| 2017/0207174 A1 * | 7/2017 | Hoshi | H01L 23/53223 |

FOREIGN PATENT DOCUMENTS

| | | |
|---|---|---|
| JP | 2002-280523 A | 9/2002 |
| JP | 2003-197773 A | 7/2003 |
| JP | 2004-525510 A | 8/2004 |
| JP | 2005-175357 A | 6/2005 |
| JP | 2009-194127 A | 8/2009 |
| JP | 2011-199141 A | 10/2011 |
| JP | 2012-129503 A | 7/2012 |
| JP | 2012-186318 A | 9/2012 |
| JP | 2013-98316 A | 5/2013 |
| JP | 2013-201357 A | 10/2013 |
| JP | 2013-232564 A | 11/2013 |
| JP | 2014-127487 A | 7/2014 |

OTHER PUBLICATIONS

Office Action issued for counterpart Japanese Application 2017-513995, issued by the Japan Patent Office dated Sep. 5, 2017.
Office Action issued for counterpart Japanese Application 2017-514055, issued by the Japan Patent Office dated Aug. 15, 2017.
K.Shenai et al., Optimum Semiconductors for High-Power Electronics, IEEE Transactions on Electron Devices, Sep. 1989, vol. 36,Issue:9, pp. 1811-1823.
B.Jayant Baliga, Silicon Carbide Power Devices,US, World Scientific Publishing Company,Mar. 30, 2006, p. 61.
International Search Report for International Patent Application No. PCT/JP2016/061206, issued by the Japan Patent Office dated Jun. 21, 2016.
International Search Report for International Patent Application No. PCT/JP2016/055112, issued by the Japan Patent Office dated May 24, 2016.
Office Action issued for the related U.S. Appl. No. 15/475,059, issued by the US Patent and Trademark Office dated Sep. 20, 2017.

* cited by examiner

HYDROGEN OCCLUSION SEMICONDUCTOR DEVICE

The contents of the following Japanese patent applications are incorporated herein by reference:
NO. 2015-085620 filed in JP on Apr. 20, 2015,
NO. 2015-122041 filed in JP on Jun. 17, 2015, and
NO. PCT/JP2016/061206 filed on Apr. 6, 2016.

BACKGROUND

1. Technical Field

The present invention relates to a semiconductor device.

2. Related Art

Conventionally, a barrier metal layer has been provided so as to prevent a corrosion of an interlayer insulating film due to an aluminum (Al) in a source electrode, and a short circuit of a gate electrode and a source electrode formed by a polysilicon. Also, so as to improve an electrical contact, a barrier metal layer has been provided between an anode electrode and a cathode electrode having Al and a polysilicon layer (for instance, refer to Patent Document 1).

PRIOR ART DOCUMENTS

Patent Document

[Patent Document 1] Japanese Patent Application Publication No. 2012-129503

Non-Patent Documents

[Non-Patent Document 1] K. Shenai (K. Shenai) and other two authors, Optimum semiconductors for high-power electronics (Optimum Semiconductors for High-Power Electronics), IEEE Transactions on Electron Devices (IEEE Transactions on Electron Devices), September 1989, Volume: 36, Issue: 9, pages: 1811-1823

[Non-Patent Document 2] Author: B. Jayant Baliga (B. Jayant Baliga), Silicon Carbide Power Devices (Silicon Carbide Power Device), US, World Scientific Publishing Company (World Scientific Publishing Co.), 30 Mar. 2006, page 61

When moisture sticks to a front surface of the semiconductor device, hydrogen derived from moisture sometimes enters inside the semiconductor device. Also, when aluminum is used as a source electrode, hydrogen which is included in aluminum sometimes enters inside the semiconductor device. Because the hydrogen has a reducing action, oxygen inside the semiconductor device is pulled out by the hydrogen, and a characteristic of an insulating film such as a silicon dioxide which is used as a gate insulating film sometimes changes. Thereby, a gate voltage threshold of a gate structure (Vth) is shifted. Penetrating of hydrogen into the semiconductor device is also an issue in the edge termination structure section which is positioned at an end portion of the semiconductor device.

SUMMARY

In a first aspect of the present invention, a semiconductor device which comprises a semiconductor substrate, a first lower insulating film and a first protective film is provided. The semiconductor substrate may have an active region and an edge termination structure section. The edge termination structure section may be provided around the active region. The first lower insulating film may be provided in the edge termination structure section on the semiconductor substrate. The first protective film may be provided on the first lower insulating film. The first protective film may be electrically insulated from the semiconductor substrate. The first protective film may occlude hydrogen.

The semiconductor substrate may be a first conductivity type. The semiconductor substrate may have a second conductivity type region on a front surface of the edge termination structure section. The first protective film may cover at least an upper side of the second conductivity type region.

The second conductivity type region may have a region in which a concentration becomes low in a direction from the active region toward the edge termination structure section.

The first protective film which is provided in the edge termination structure section may be electrically insulated from the active region.

The semiconductor device may further comprise a first upper insulating film on the first protective film which is provided in the edge termination structure section.

The first protective film may be integrally formed in the edge termination structure section.

The semiconductor substrate may further comprise a step portion which has a sloped portion and a flat portion in the edge termination structure section. The first protective film may be provided covering a whole upper side of the semiconductor substrate which includes the step portion in the edge termination structure section.

The semiconductor device may further comprise a gate runner portion and a gate pad portion. The gate runner portion may be provided between the active region and the edge termination structure section. The gate pad portion may be provided between the active region and the gate runner portion. The gate runner portion and the gate pad portion may have a second lower insulating film and a second protective film. The second lower insulating film may be provided on the semiconductor substrate. The second protective film may be provided on the second lower insulating film. The second protective film may occlude hydrogen.

The active region may further comprise a third lower insulating film and a third protective film. The third lower insulating film may be provided on the semiconductor substrate. The third protective film may be provided on the third lower insulating film. The third protective film may occlude hydrogen.

The active region may further comprise a contact portion. The contact portion may provide an electrical connection between the semiconductor substrate and the third protective film. The third protective film may be provided on the semiconductor substrate. In the contact portion, the semiconductor substrate may have at least a nickel silicide. In the contact portion, the third protective film may have at least titanium carbide.

A thickness of the first protective film in the edge termination structure section may be larger than a thickness of the third protective film in the active region.

A thickness of the third protective film in the active region may be larger than a thickness of the first protective film in the edge termination structure section.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments do not limit the invention according to the scope of claim. Also, all the combinations of the features described in the embodiments are not necessarily essential to means provided by aspects of the invention.

In the present specification, 'n' or 'p' respectively mean that the electrons or holes are majority carriers. Also, for '+' or '−' attached on 'n' or 'p', '+' means the higher impurity concentration than what to which it is not described, and '−' means the lower impurity concentration than what to which it is not described. Also, in the example described in the present specification, a first conductivity type means n-type and a second conductivity type means p-type, but in another example, a first conductivity type may mean p-type and a second conductivity type may mean n-type.

Figure 1:
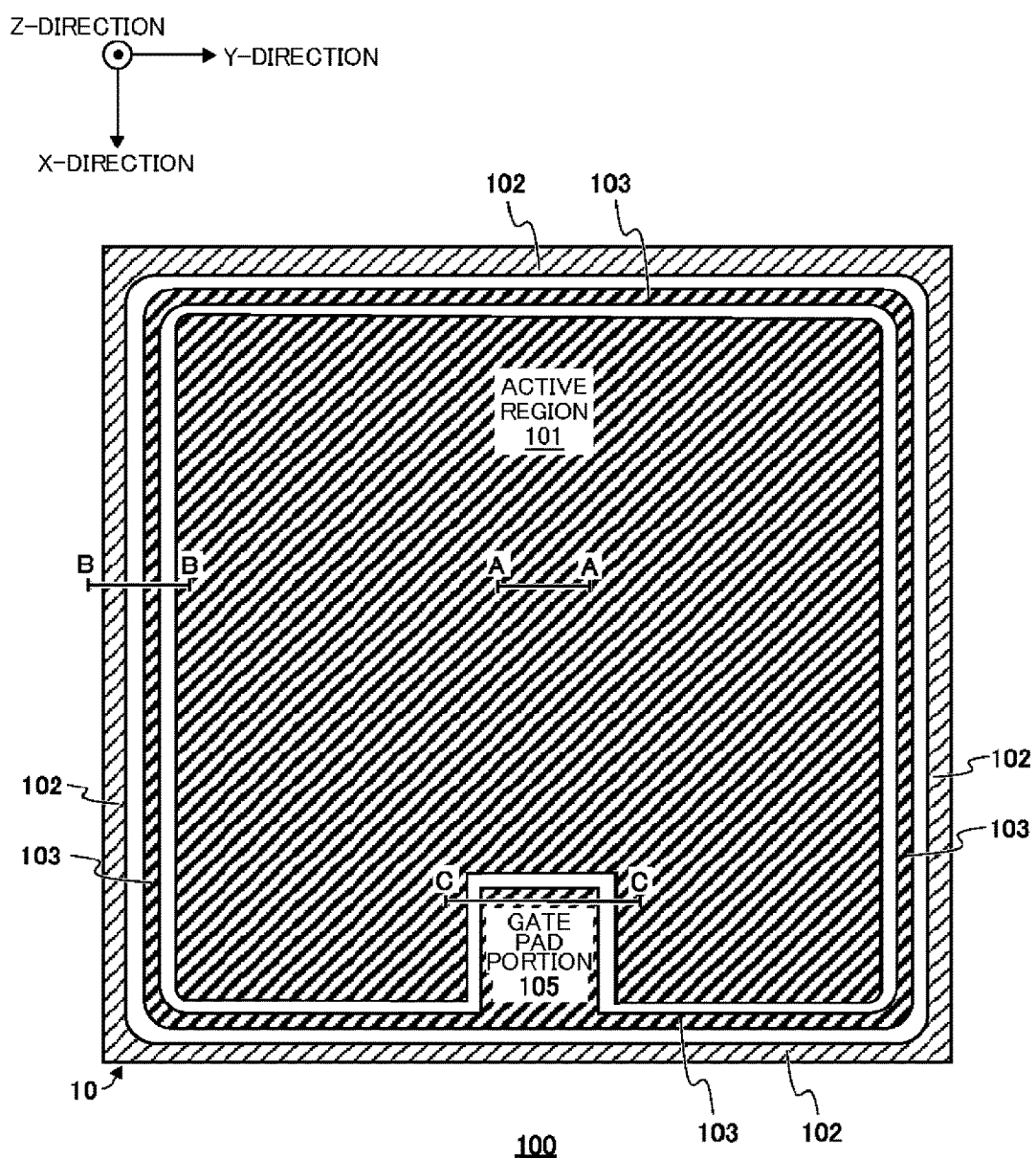
FIG. 1 is a diagram showing a plan view of a semiconductor device 100.

FIG. 1 is a diagram showing a plan view of a semiconductor device 100. That is, FIG. 1 is a diagram showing a semiconductor substrate 10 as seen from above. The semiconductor device 100 has a surface which is parallel to the x-y plane. An x-direction and a y-direction are directions perpendicular to each other, and a z-direction is a direction perpendicular to the x-y plane. In the present specification, a front surface side means a side in the plus (+) z-direction of an object which has a surface parallel to the x-y plane, and a back surface side means a side in the minus (−) z-direction of the object. A surface positioned between the front surface side and the back surface side of the object is referred to as a side face of the object. Note that the front surface of the semiconductor substrate 10 is described as a front surface 14, and the back surface of the semiconductor substrate 10 is described as a back surface 16.

The semiconductor device 100 has the semiconductor substrate 10. In the semiconductor substrate 10, an active region 101 and an edge termination structure section 102 are provided. The edge termination structure section 102 is provided around the active region 101. The expression "A is provided around B in the semiconductor device 100" means that A is provided surrounding B when the semiconductor device 100 is seen from above as in FIG. 1.

The active region 101 of the present example is a region which has a vertical MOSFET (Metal Oxide Semiconductor Field Effect Transistor). However, in another example, the active region 101 may have an IGBT (Insulated Gate Bipolar Transistor) instead of the vertical MOSFET.

The edge termination structure section 102 is a portion which has a feature to relax or distribute an electric field concentration in an end portion of the semiconductor substrate 10. The semiconductor substrate 10 has a below-described JTE (Junction Termination Extension) structure in the edge termination structure section 102. The JTE structure has below-described JTE high concentration region 37 and JTE low concentration region 38 provided around the active region 101.

The semiconductor device 100 further comprises a gate runner portion 103 and a gate pad portion 105. The gate runner portion 103 is provided between the active region 101 and the edge termination structure section 102 when the semiconductor device 100 is seen from above. The gate runner portion 103 is provided around the active region 101. The gate runner portion 103 is a wiring electrically connected to a below-described gate electrode 34.

The gate pad portion 105 is provided between the active region 101 and the gate runner portion 103 when the semiconductor device 100 is seen from above. The gate pad portion 105 is provided to be electrically connected to the gate runner portion 103. The gate pad portion 105 is a portion protruding from the gate runner portion 103 to the active region 101. The gate pad portion 105 provides an electrical connection to the outside wiring. For instance, a gate terminal wiring is connected to the gate pad portion 105 by wire bonding.

Figure 2:
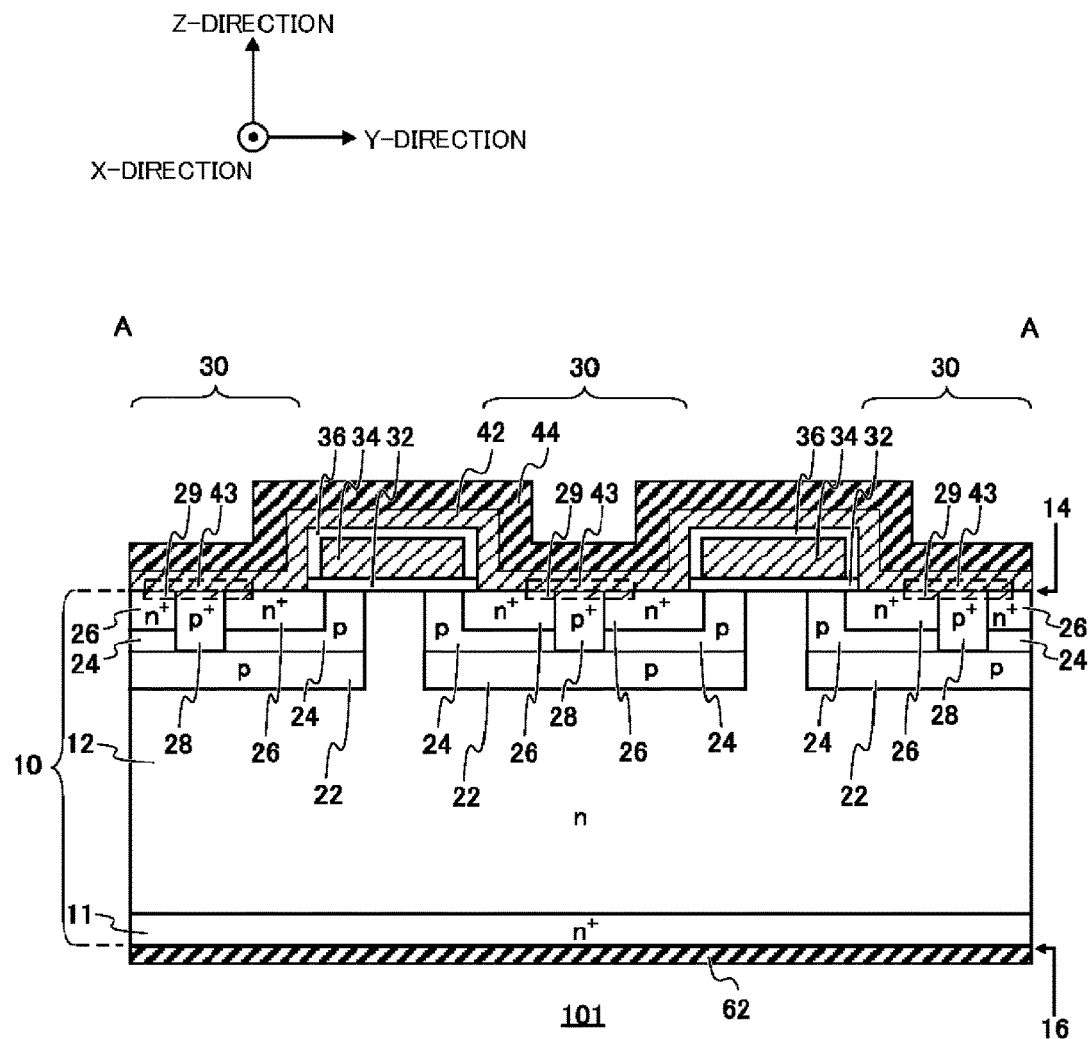
FIG. 2 is a cross-sectional view taken along A-A in FIG. 1.

FIG. 2 is a cross-sectional view taken along A-A in FIG. 1. FIG. 2 is a diagram showing a cross section of the active region 101. The semiconductor substrate 10 of the present example has a silicon carbide (SiC). However, the semiconductor substrate 10 may be another wide gap semiconductor material. For instance, in another example, the semiconductor substrate 10 has a gallium nitride (GaN).

The semiconductor substrate 10 is a first conductivity type. The semiconductor substrate 10 has an $n^+$-type first conductivity type layer 11 on a back surface 16 side, and has an n-type drift layer 12 on a front surface 14 side. The semiconductor substrate 10 has a p-type well region 22, a p-type base region 24, $n^+$-type source region 26 and a $p^+$-type contact region 28 on the front surface 14 side of the drift layer 12.

At least a portion of the base region 24 is provided under the gate electrode 34. In the present specification, "on" or "upper" refers to a direction from the back surface 16 toward the front surface 14 of the semiconductor substrate 10. In contrast, "under" or "lower" refers to a direction from the front surface 14 toward the back surface 16 of the semiconductor substrate 10. The base region 24 functions as a channel forming region. When an electric field is applied from the gate electrode 34 via the gate insulating film 32, a channel is formed in a portion of the base region 24.

The $n^+$-type source region 26 is provided inside the base region 24 being sandwiched between or surrounded by the base region 24. The $p^+$-type contact region 28 is provided inside the base region 24 being sandwiched between or surrounded by the source region 26. The $p^+$-type contact region 28 has a feature to decrease a contact resistance with a source electrode.

The gate insulating film 32 electrically insulates at least the base region 24 and the gate electrode 34. The gate insulating film 32 of the present example is provided being in contact with the base region 24 and the source region 26 on the front surface 14.

The gate electrode 34 is provided on the gate insulating film 32. An interlayer insulating film 36 as a third lower insulating layer is positioned on the gate electrode 34. The interlayer insulating film 36 is provided surrounding the front surface side and the side face of the gate electrode 34. The interlayer insulating film 36 may be a PSG (Phosphosilicate Glass) film or a BPSG (Borophosphosilicate Glass) film.

A titanium (Ti) film 42 is provided as a third protective film on the interlayer insulating film 36. The titanium film 42 has a feature to occlude hydrogen. The titanium film 42 may include a titanium silicide (TiSix).

A metal layer 44 is provided on the titanium film 42. The metal layer 44 may be aluminum (Al), or may be aluminium alloys such as aluminum silicide (AlSi) which contains 1% of silicon (Si) at a weight ratio. The titanium film 42 and the metal layer 44 function as source electrodes in the active region 101. Note that a drain electrode 62 is provided under the back surface 16 of the semiconductor substrate 10.

A contact portion 30 is a region where the titanium film 42 is in contact with the source region 26 and the contact region 28. The contact portion 30 provides an electrical connection between the semiconductor substrate 10 and the titanium film 42. In the contact portion 30, a portion of the source region 26 and the contact region 28 have a nickel silicide (NiSi) region 29. Also, in the contact portion 30, the titanium film 42 has at least a titanium carbide (TiC) region 43.

Figure 3:
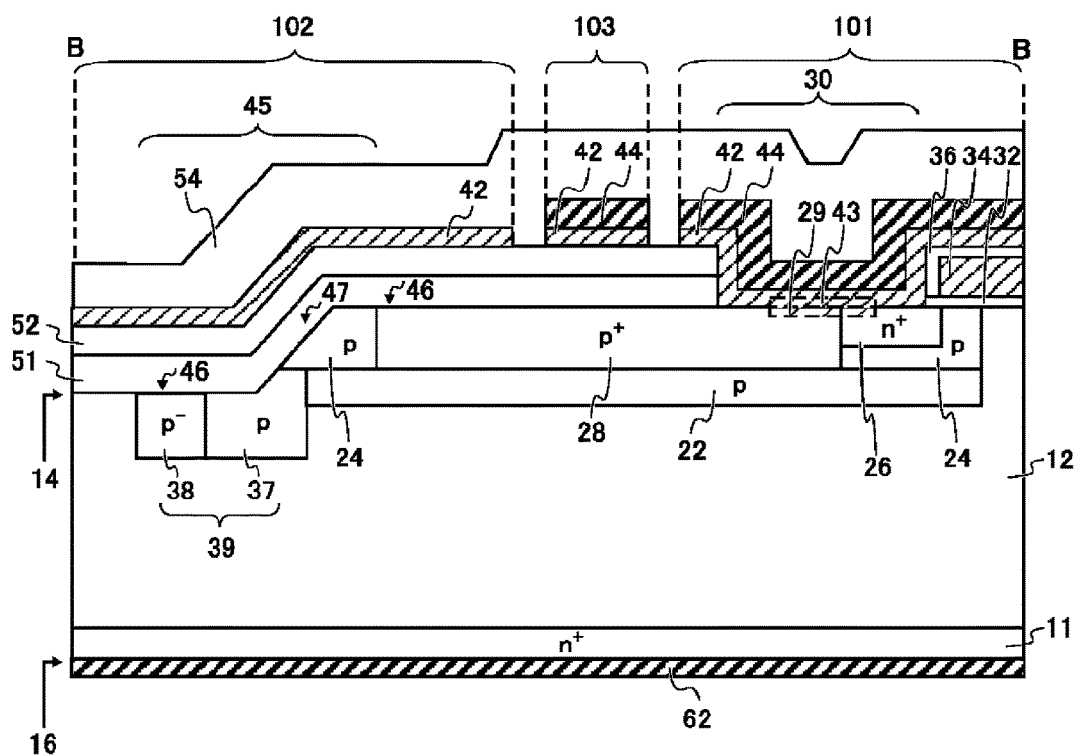
FIG. 3 is a cross-sectional view taken along B-B in FIG. 1.

FIG. 3 is a cross-sectional view taken along B-B in FIG. 1. FIG. 3 is a diagram showing a cross section over an end portion of the active region 101, the gate runner portion 103 and the edge termination structure section 102. On the semiconductor substrate 10, a laminated body of an insulating film 51 and an interlayer insulating film 52 is provided from an outer circumference end portion of the active region 101 to an outer circumference end portion of the edge termination structure section 102. The insulating film 51 may be an oxide film such as a silicon oxide ($SiO_2$), a PSG or a BPSG. The interlayer insulating film 52 may be the same material as the interlayer insulating film 36. The interlayer insulating film 52 may be a PSG or a BPSG.

The gate runner portion 103 has an interlayer insulating film 52 as a second lower insulating film, a titanium film 42 as a second protective film, and a metal layer 44. The titanium film 42 is provided on the interlayer insulating film 52. The titanium film 42 occludes hydrogen. In the present example, penetrating of active hydrogen into the semiconductor substrate 10 can be prevented in the gate runner portion 103, as well as in the active region 101.

The edge termination structure section 102 has at least an interlayer insulating film 52 as a first lower insulating film, and a titanium film 42 as a first protective film. Note that as is evident from the above description, first to third protective films of the present example are titanium films 42. The titanium film 42 of the edge termination structure section 102 is provided on the interlayer insulating film 52, and thus the titanium film 42 is electrically insulated from the semiconductor substrate 10.

In the present example, a titanium film 42 which occludes a hydrogen is also provided in the edge termination structure section 102. Thereby, penetrating of active hydrogen from the edge termination structure section 102 into the semiconductor substrate 10 can be prevented. Therefore, varying of a gate threshold of the active region 101 can be prevented.

A passivation film 54 as a first upper insulating film is provided on the titanium film 42 of the edge termination structure section 102. The passivation film 54 is provided at the uppermost side in the active region 101, the edge termination structure section 102, and the gate runner portion 103. Note that the passivation film 54 is partially removed in order to secure an electrical conduction with the outside in the active region 101 and the gate pad portion 105.

The titanium film 42 of the edge termination structure section 102 has a floating potential. The titanium film 42 which is provided in the edge termination structure section 102 is electrically insulated from the active region 101. The titanium film 42 of the edge termination structure section 102 is similarly electrically insulated from the gate runner portion 103. A spacing distance of the titanium film 42 between the edge termination structure section 102 and the gate runner portion 103 may be 2 µm or more, and 10 µm or less. Note that spacing distance of the titanium film 42 between the active region 101 and the gate runner portion 103 may also be 2 µm or more, and 10 µm or less.

The semiconductor substrate 10 has a step portion 45 in the edge termination structure section 102. The step portion 45 has two flat portions 46 with different height positions in the z-direction, and a sloped portion 47 between the two flat portions 46. A second conductivity type region 39 is provided in one of the two flat portions 46 which is positioned lower than the other flat portion 46. Because the titanium film 42 has a floating potential, no voltage is applied to the second conductivity type region 39. This allows the edge termination structure section 102 to function not as a field plate structure, but as a JTE structure. Thereby, the breakdown of the insulating film 51 and the interlayer insulating film 52 can be prevented.

The semiconductor substrate 10 has a JTE high concentration region 37 and a JTE low concentration region 38 as a second conductivity type region 39 on the front surface 14 of the edge termination structure section 102. The JTE low concentration region 38 has lower p-type impurity concentration than the JTE high concentration region 37. The JTE high concentration region 37 of the present example has p-type impurities, and the JTE low concentration region 38 has $p^-$-type impurities. That is, the second conductivity type region 39 is a region in which a concentration of the p-type impurities becomes low in a direction from the active region 101 toward the edge termination structure section 102.

A titanium film 42 is integrally formed in the edge termination structure section 102. The expression "the titanium film 42 is integrally formed" means that the titanium film 42 is a solid film. For instance, this means that there is no hole or opening or the like formed in the titanium film 42 in the edge termination structure section 102.

The titanium film 42 covers at least an upper side of the second conductivity type region 39 in the edge termination structure section 102. The titanium film 42 of the present example is provided covering a whole upper side of the semiconductor substrate 10 which includes the step portion 45 in the edge termination structure section 102. In other words, the titanium film 42 may be provided covering a whole upper side of the edge termination structure section 102. This can prevent penetrating of a hydrogen into the JTE high concentration region 37 and the JTE low concentration region 38, thereby preventing varying of a breakdown voltage characteristic in the edge termination structure section 102.

Figure 4:
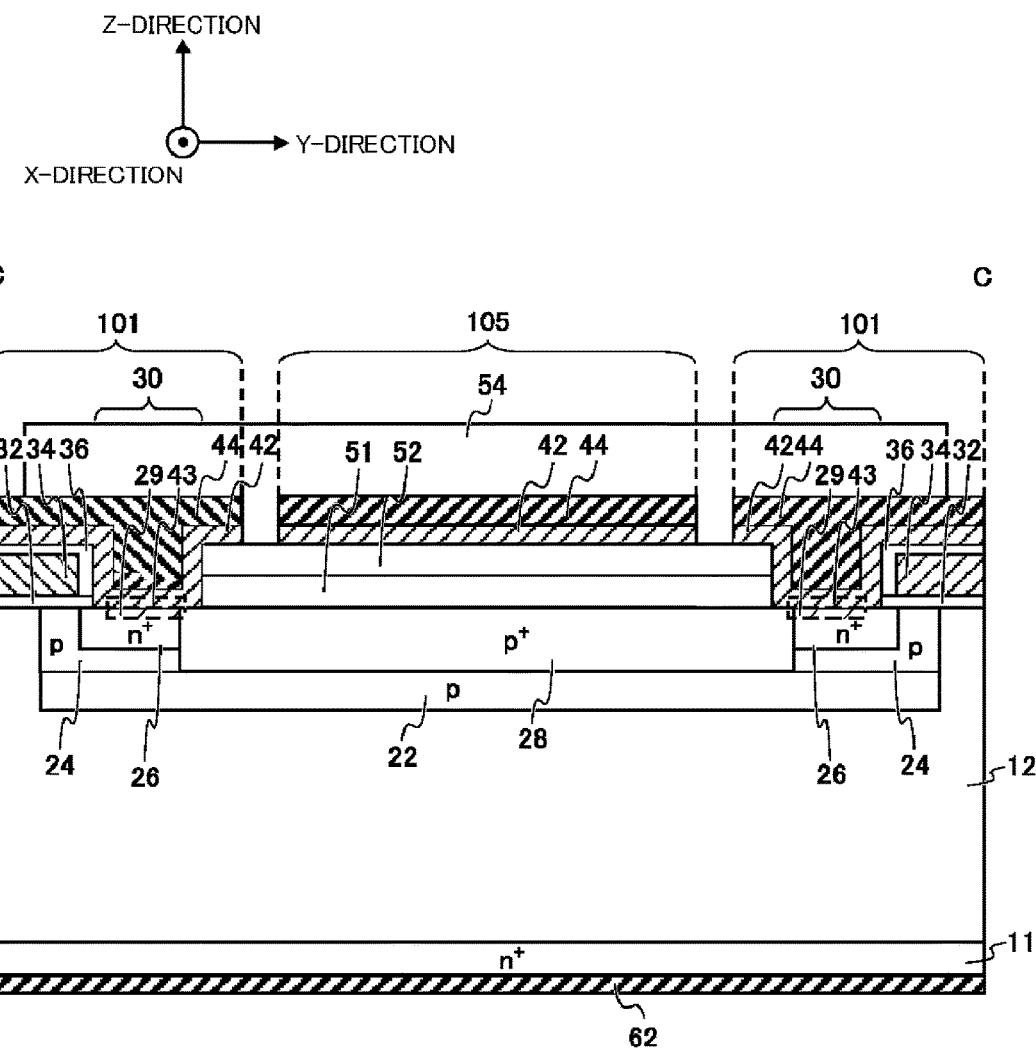
FIG. 4 is a cross-sectional view taken along C-C in FIG. 1.

FIG. 4 is a cross-sectional view taken along C-C in FIG. 1. FIG. 4 is a diagram showing a cross section of the gate pad portion 105. On the semiconductor substrate 10, a laminated body of an insulating film 51 and an interlayer insulating film 52 is provided from the gate pad portion 105 to the active region 101. The gate pad portion 105 has an interlayer insulating film 52 as a second lower insulating film, a titanium film 42 as a second protective film, and a metal layer 44. The titanium film 42 is provided on the interlayer insulating film 52. Because the titanium film 42 occludes hydrogen, penetrating of an active hydrogen into the semiconductor substrate 10 can be prevented in the gate pad portion 105, as well as in the active region 101.

Figure 5:
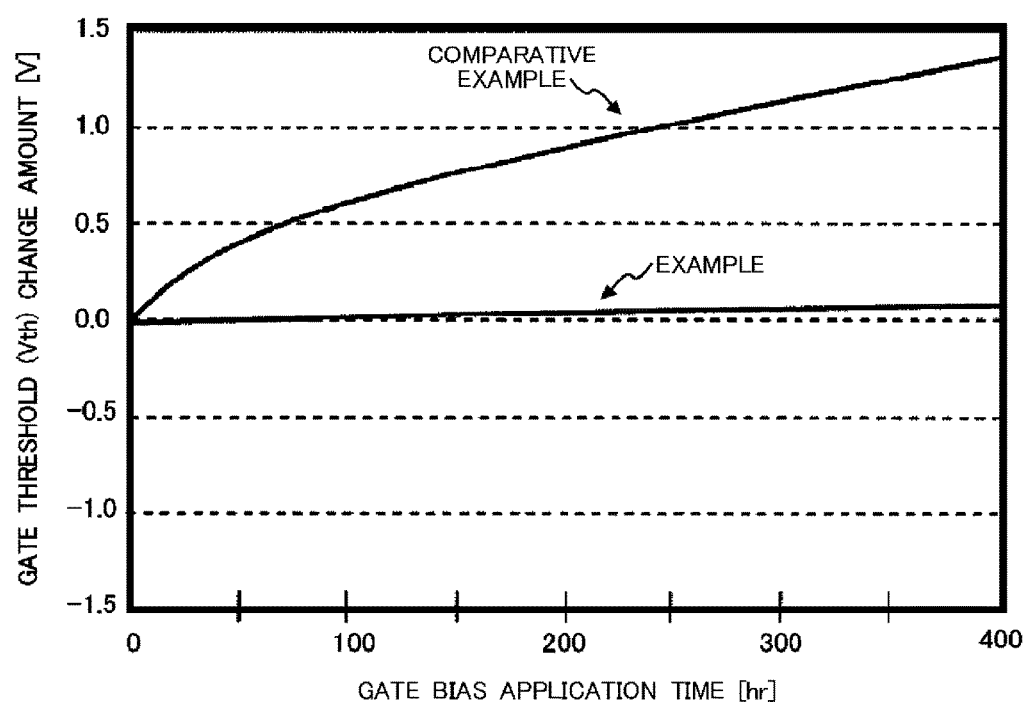
FIG. 5 is a diagram showing a gate threshold (Vth) change amount with respect to a gate bias application time.

FIG. 5 is a diagram showing a gate threshold (Vth) change amount with respect to a gate bias application time. The gate bias is successively applied to the gate electrode 34, and a change of the gate threshold is tested and measured. The horizontal axis is a gate bias application time [hr], and the vertical axis is a gate threshold (Vth) change amount [V].

"A comparative example" in FIG. 5 shows a test result when a titanium film 42 is provided only in the active region 101. In contrast, "an example" shows a test result when a titanium film 42 is provided in the active region 101, the FIG. 5, the edge termination structure section 102, the gate runner portion 103 and the gate pad portion 105. As is evident from FIG. 5, for instance, a gate threshold change amount after four hundred hours is 10-fold or more larger in the comparative example than in the example. The test result of FIG. 5 shows that providing a titanium film 42 other than in the active region 101 is effective in order to reduce the gate threshold change amount.

FIG. 6A to FIG. 6F are diagrams showing fabrication steps of the semiconductor device 100. Note that although in FIG. 6A to FIG. 6F, C-C cross section is omitted, a layer, a region, and a film or the like which are shown by the same label in A-A cross section, B-B cross section, and C-C cross section are made by the same steps. For instance, the source region 26 and the contact region 28 in the active region 101, the edge termination structure section 102, and the gate pad portion 105 are formed in the step of FIG. 6B.

Figure 6A:
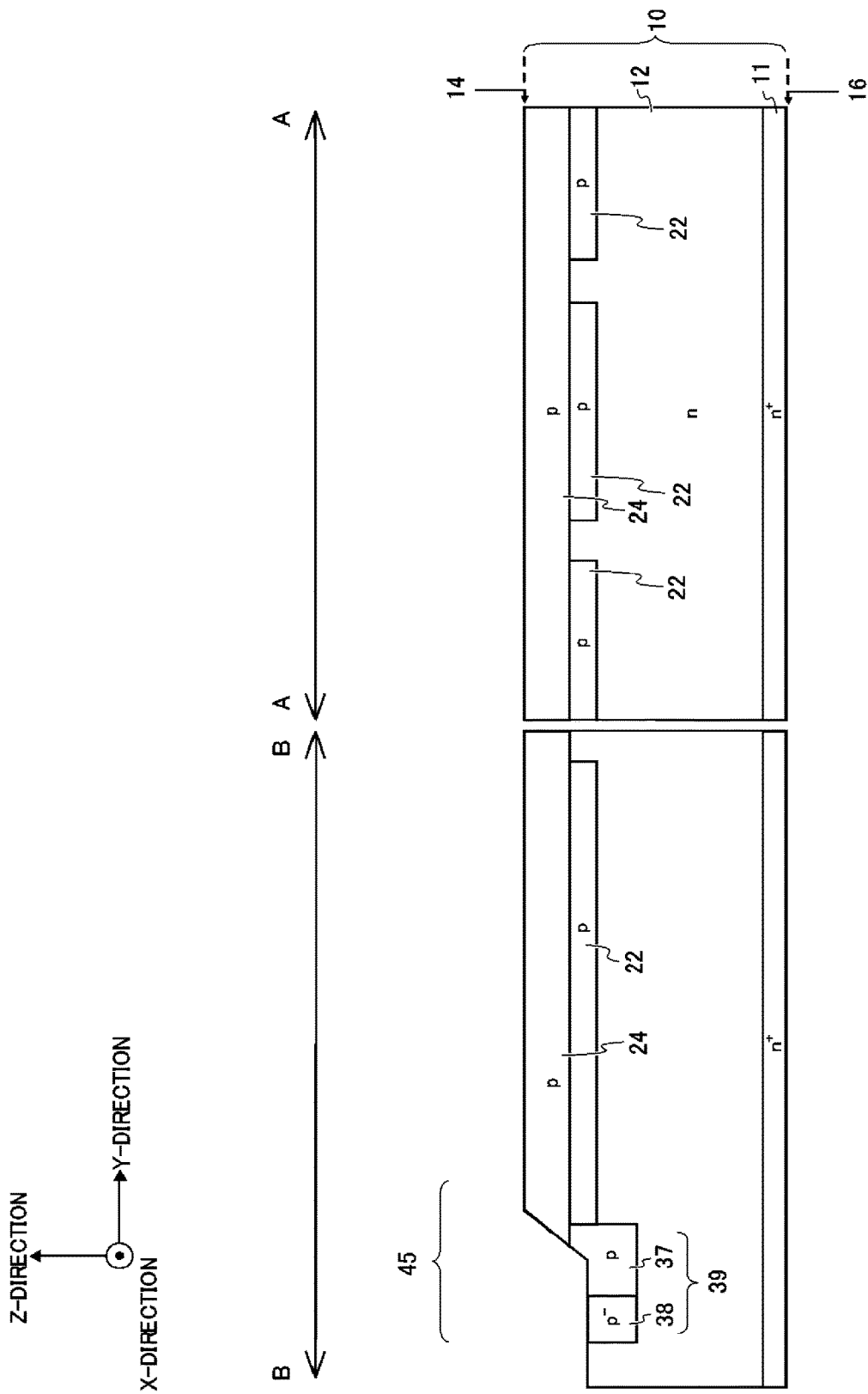
FIG. 6A is a diagram showing a step to form a drift layer 12 and multiple p-type regions.

FIG. 6A is a diagram showing a step to form a drift layer 12 and multiple p-type regions. First, a first conductivity type layer 11 which has an n-type impurity concentration with approximately $2.0E19$ cm$^{-3}$ is prepared. Note that the letter "E" means powers of 10. For instance, E19 means 10 to the power of 19. The first conductivity type layer 11 of the present example is an n$^+$-type SiC substrate. The n$^+$-type SiC substrate may be a (000-1) surface in which the main surface has an off angle about four degrees in the <11-20> direction.

Next, on a upper side of the first conductivity type layer 11, a drift layer 12 which has an n-type impurity concentration with approximately $1.0E16$ cm$^{-3}$ is grown by approximately 10 µm by the epitaxial method. Although n-type impurities in the first conductivity type layer 11 and the drift layer 12 are N (nitrogen), other impurities may be used if they are n-type impurities.

Next, on the front surface side of the drift layer 12, a well region 22 and a base region 24 which has a p-type impurity concentration with approximately $2.0E16$ cm$^{-3}$ are grown with approximately 0.5 µm by the epitaxial method. Although p-type impurity of the present example is Al, other impurities may be used for p-type dopants. Note that in regions other than the well region 22 and the base region 24, the drift layer 12 is grown with approximately 0.5 µm by the epitaxial method.

Note that around an end portion of the drift layer 12 is partially removed by etching, and a recess is formed. After that, by forming a JTE high concentration region 37 and a JTE low concentration region 38 by the epitaxial method, a second conductivity type region 39 is formed. By adjusting the impurity concentration when epitaxial growing, the JTE high concentration region 37 can be made a p-type, and the JTE low concentration region 38 can be made a p$^-$-type.

Figure 6B:
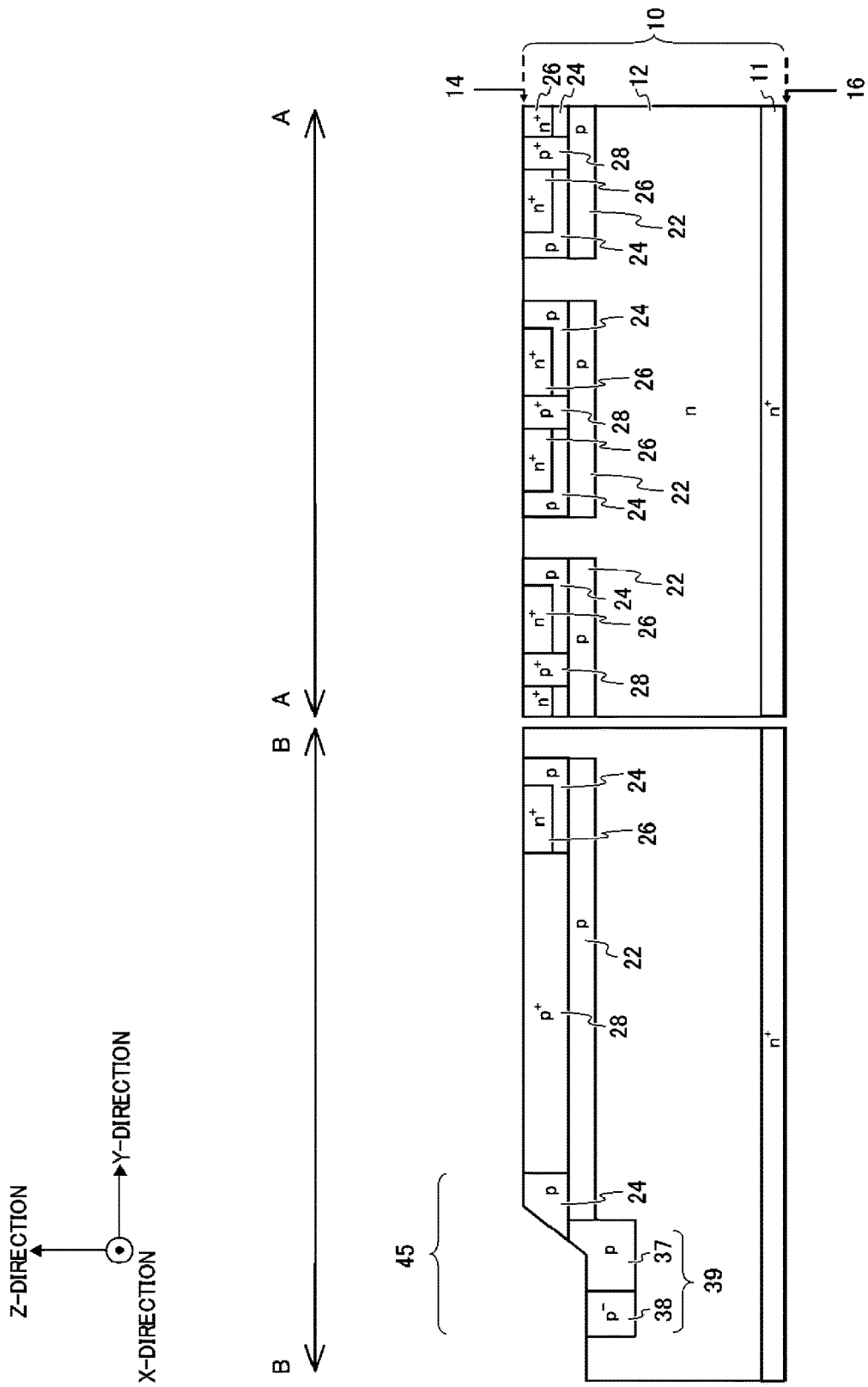
FIG. 6B is a diagram showing a step to form a source region 26 and a contact region 28.

FIG. 6B is a diagram showing a step to form a source region 26 and a contact region 28. FIG. 6B is a diagram showing a step after FIG. 6A. In the step of FIG. 6B, a contact region 28 is selectively formed on the front surface side of the base region 24 by photolithography and ion implantation. Next, a source region 26 is selectively formed on the front surface side of the base region 24 by photolithography and ion implantation. Next, the semiconductor substrate 10 is heat treated in order to activate implanted impurities.

Figure 6C:
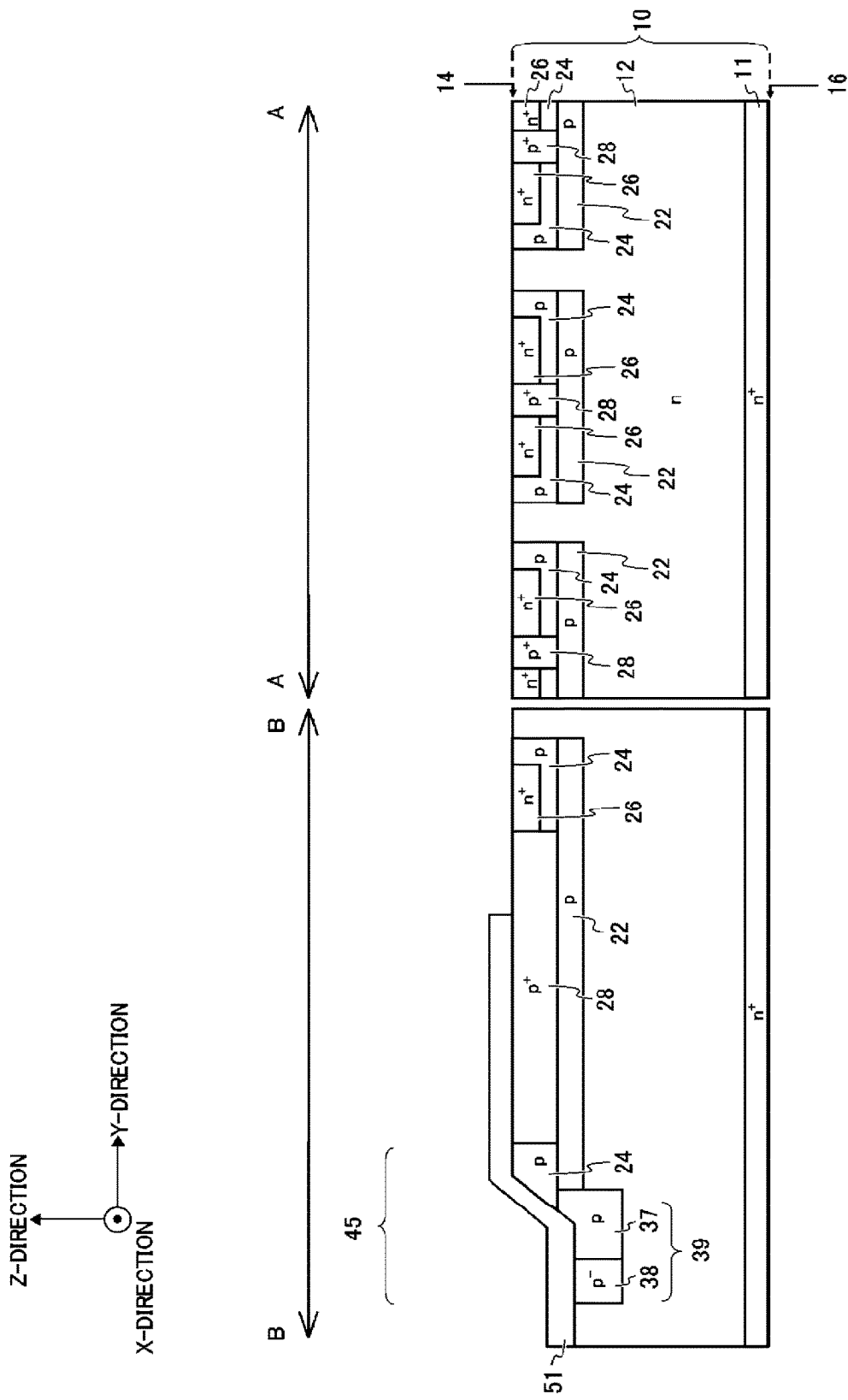
FIG. 6C is a diagram showing a step to form an insulating film 51.

FIG. 6C is a diagram showing a step to form an insulating film 51. FIG. 6C is a diagram showing a step after FIG. 6B. In the step of FIG. 6C, an insulating film 51 is selectively provided on the semiconductor substrate 10. The insulating film 51 may be provided to have a thickness of 2,000 angstrom or more.

Figure 6D:
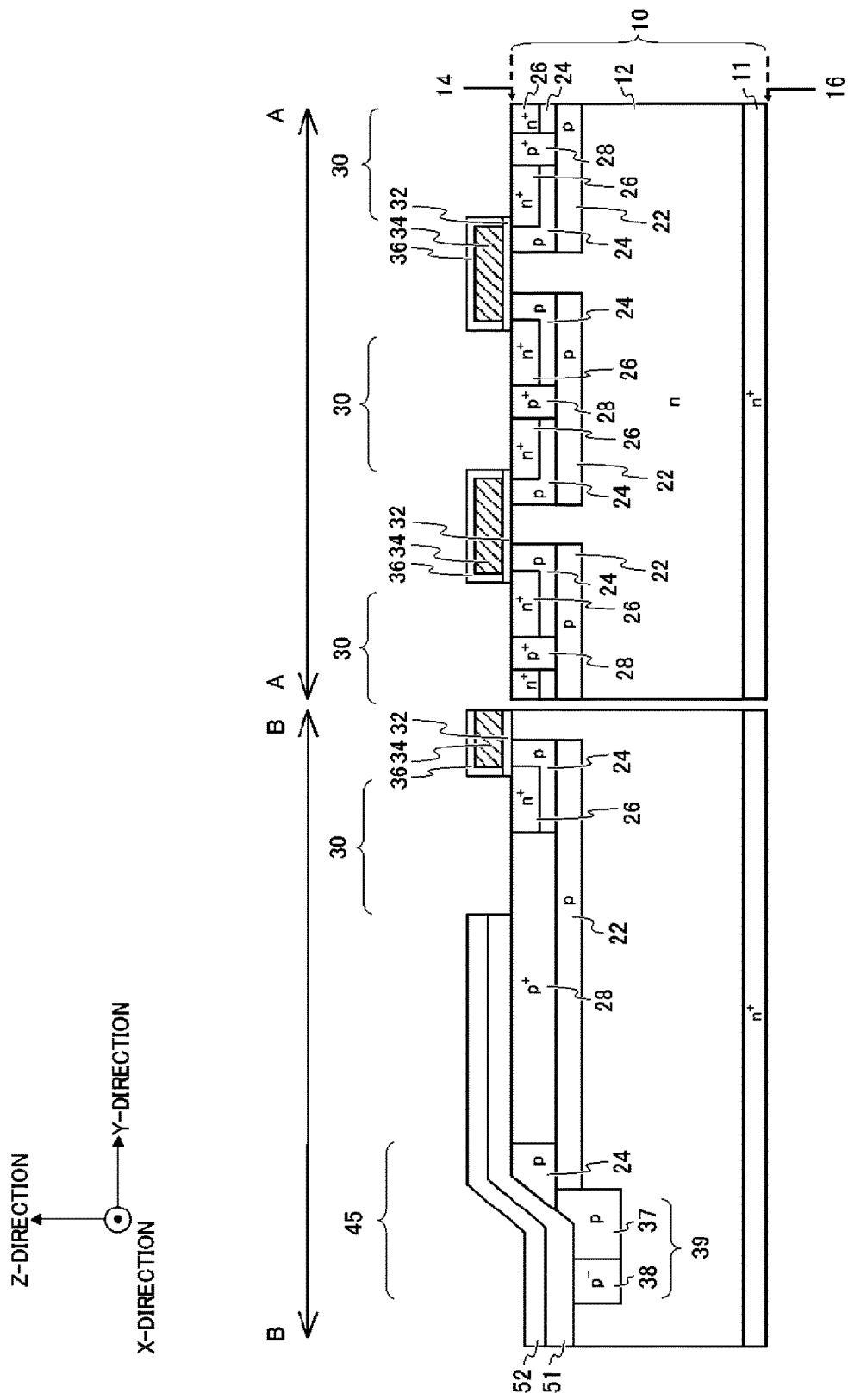
FIG. 6D is a diagram showing a step to form a gate insulating film 32, a gate electrode 34, an interlayer insulating film 36 and an interlayer insulating film 52.

FIG. 6D is a diagram showing a step to form a gate insulating film 32, a gate electrode 34, an interlayer insulating film 36 and an interlayer insulating film 52. FIG. 6D is a diagram showing a step after FIG. 6C. In the step of FIG. 6D, a gate insulating film 32 is formed by making the semiconductor substrate 10 exposed a temperature approximately at 1,000 degrees Celsius and thermally oxidizing under a mixing atmosphere of oxygen and hydrogen. A thickness of the gate insulating film 32 may be approximately 100 nm.

Next, a phosphorous-doped polycrystalline silicon film is formed on the front surface side of the gate insulating film 32. Next, by selectively removing the polycrystalline silicon film by photolithography, a gate electrode 34 which has the polycrystalline silicon film is formed. Next, an interlayer insulating film 36 is formed on the front surface side and the side face of the gate electrode 34, an interlayer insulating film 52 is also formed so as to cover a whole upper side of the semiconductor substrate 10 including the step portion 45 of the edge termination structure section 102. The interlayer insulating film 36 and the interlayer insulating film 52 are PSGs, a film thickness is a thickness of approximately 1.0 µm.

Next, multiple contact portions 30 are formed by patterning the gate insulating film 32, the interlayer insulating film 36 and the interlayer insulating film 52 by photolithography. Next, The interlayer insulating film 36 and the interlayer insulating film 52 are made to reflow and flattened by heat treating the semiconductor substrate 10.

Figure 6E:
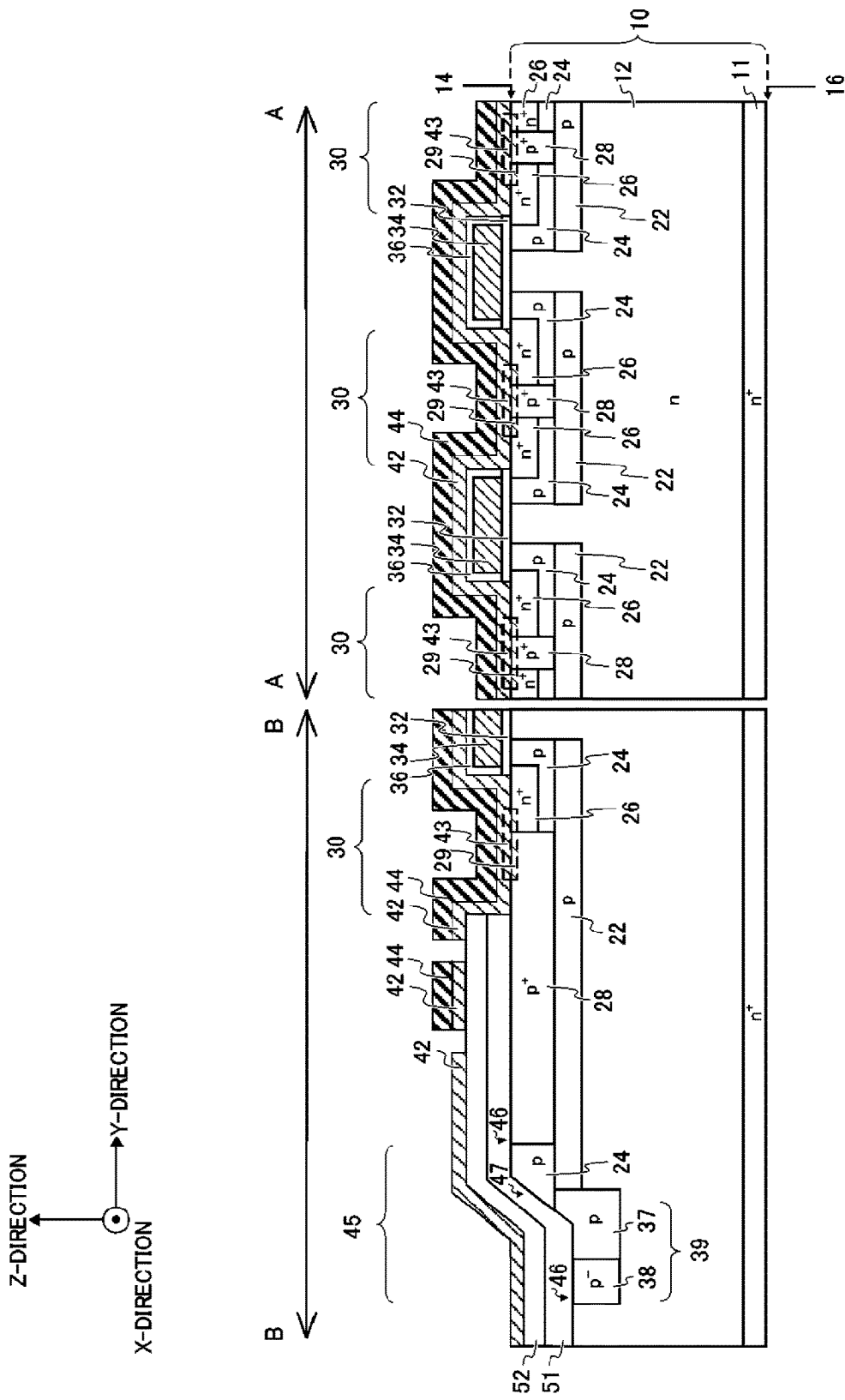
FIG. 6E is a diagram showing a step to form a titanium film 42 and a metal layer 44.

FIG. 6E is a diagram showing a step to form a titanium film 42 and a metal layer 44. FIG. 6E is a diagram showing a step after FIG. 6D. In the step of FIG. 6E, the titanium film 42 is formed at a thickness of 1,000 angstrom (=100 nm=0.1 µm) or more, 0.5 µm or less by sputtering. By making the thickness 0.1 µm or more, a step-cut of the titanium film 42 in the step portion 45 can be prevented.

After that, the titanium film 42 is patterned by photolithography. Note that before forming the titanium film 42, a nickel silicide region 29 may be formed by introducing nickel (Ni) to the semiconductor substrate 10 exposed in the contact portion 30. The titanium film 42 in contact with the nickel silicide region 29 may have a titanium carbide region 43.

Note that, as a variation, a thickness of the titanium film 42 as the first protective film in the edge termination structure section 102 may be larger than a thickness of the titanium film 42 as the third protective film in the active region 101. For instance, the thickness of the titanium film 42 of the edge termination structure section 102 is made to be larger than 0.5 µm. When the semiconductor device 100 is seen from above, the area of the titanium film 42 of the edge termination structure section 102 is about 10% of the whole. By making the thickness of the titanium film 42 of the edge termination structure section 102 larger, hydrogen occlusion effect in the edge termination structure section 102 can be ensured more.

Also, instead of the variation, a thickness of the titanium film 42 as the third protective film in the active region 101 may be larger than a thickness of the titanium film 42 as the first protective film in the edge termination structure section 102. For instance, the thickness of the titanium film 42 of the active region 101 is 4-fold of the thickness of the titanium film 42 of the edge termination structure section 102. In the active region 101, about 50 nm thickness of the titanium film 42 sometimes becomes titanium aluminum alloys (TiAl) by a metal layer 44 including aluminum (Al) and a titanium film 42 being reacted. Titanium aluminum alloys have a smaller hydrogen occlusion effect than titanium. So, by making the thickness of the titanium film 42 of the active region 101 larger than the thickness of the titanium film 42 of the edge termination structure section 102, hydrogen occlusion effect in the active region 101 can be ensured more.

Next, a metal layer 44 is formed at a thickness of 5 µm. The metal layer 44 of the present example is aluminum silicide (AlSi). The metal layer 44 is selectively formed except for the step portion 45 of the edge termination structure section 102.

Figure 6F:
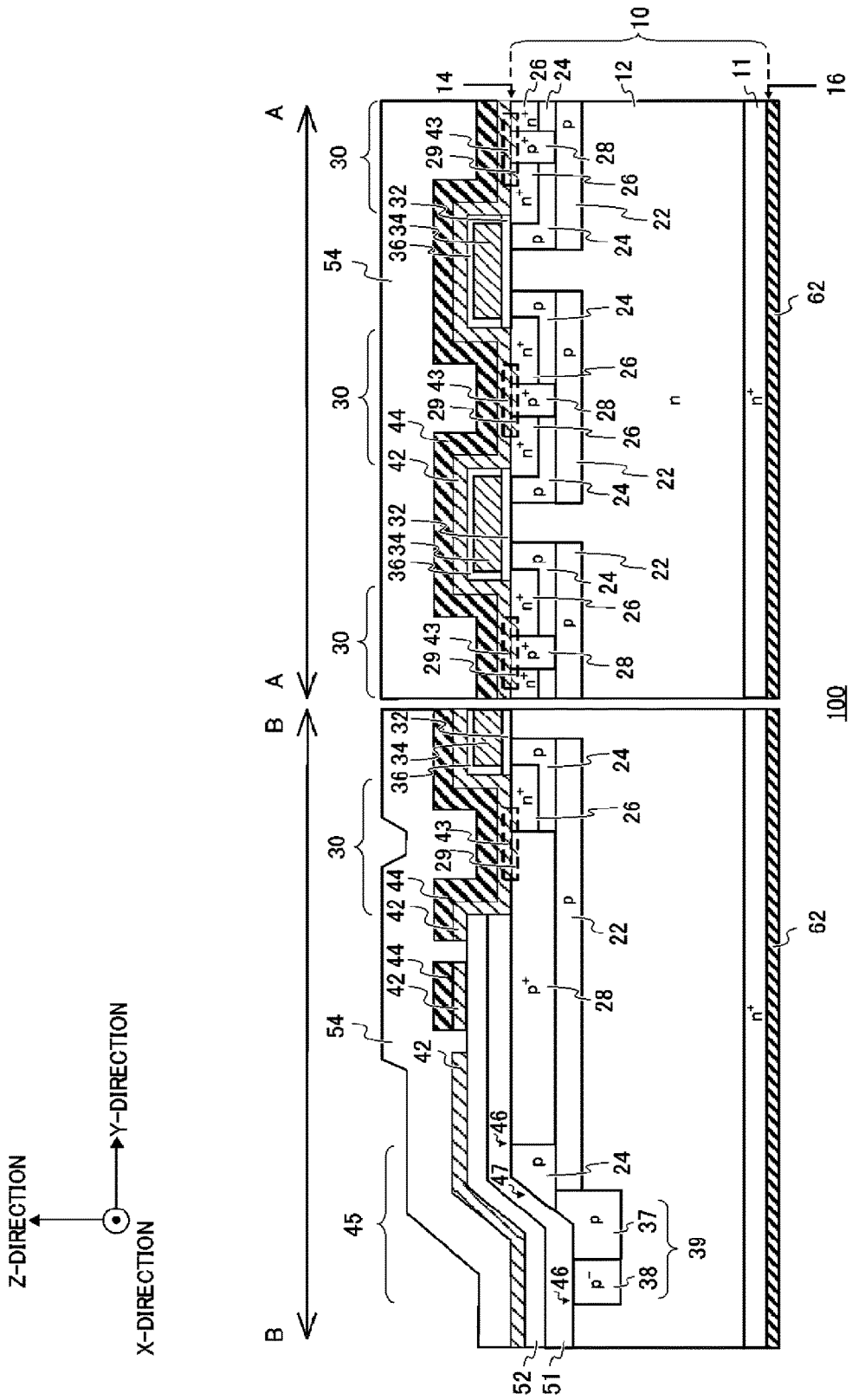
FIG. 6F is a diagram showing a step to form a passivation film 54 and a drain electrode 62.

FIG. 6F is a diagram showing a step to form a passivation film 54 and a drain electrode 62. FIG. 6F is a diagram showing a step after FIG. 6E. In the step of FIG. 6F, first, a nickel (Ni) is formed on the back surface side of the semiconductor substrate 10 by the sputtering method, and is heat treated at 970 degrees Celsius. Thereby, an ohmic contact region is formed on the back surface 16. A titanium (Ti), a nickel (Ni), and a gold (Au) film are formed in this order on the further back surface side of the ohmic contact region by the sputtering method. Thereby, a drain electrode 62 is formed.

Next, a passivation film 54 is formed on the whole surface on the front surface side of the semiconductor substrate 10. After that, the passivation film 54 is removed at a portion of the active region 101 which provides a source terminal wiring, and in a portion of the gate pad portion 105 which provides a gate terminal wiring. Thereby, the semiconductor device 100 is completed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 11 . . . first conductivity type layer, 12 . . . drift layer, 14 . . . front surface, 16 . . . back surface, 22 . . . well region, 24 . . . base region, 26 . . . source region, 28 . . . contact region, 29 . . . nickel silicide region, 30 . . . contact portion, 32 . . . gate insulating film, 34 . . . gate electrode, 36 . . . interlayer insulating film, 37 . . . JTE high concentration region, 38 . . . JTE low concentration region, 39 . . . second conductivity type region, 42 . . . titanium film, 43 . . . titanium carbide region, 44 . . . metal layer, 45 . . . step portion, 46 . . . flat portion, 47 . . . sloped portion, 51 . . . insulating film, 52 . . . interlayer insulating film, 54 . . . passivation film, 62 . . . drain electrode, 100 . . . semiconductor device, 101 . . . active region, 102 . . . edge termination structure section, 103 . . . gate runner portion, 105 . . . gate pad portion

What is claimed is:

1. A semiconductor device comprising:
   a semiconductor substrate which has an active region and an edge termination structure section which is provided around the active region,
   a first lower insulating film which is provided on the edge termination structure section on the semiconductor substrate,
   a first protective film which is provided on the first lower insulating film, and is electrically insulated from the semiconductor substrate, and occludes hydrogen,
   a gate runner portion between the active region and the edge termination structure section, and
   a gate pad portion between the active region and the gate runner portion, wherein
   the gate runner portion and the gate pad portion has:
   a second lower insulating film on the semiconductor substrate, and
   a second protective film which is provided on the second lower insulating film, and occludes hydrogen.

2. The semiconductor device according to claim 1, wherein
   the semiconductor substrate is a first conductivity type,
   the semiconductor substrate has a second conductivity type region on a front surface of the edge termination structure section, and
   the first protective film covers at least an upper side of the second conductivity type region.

3. The semiconductor device according to claim 1, wherein
   the active region further comprises:
   a third lower insulating film which is provided on the semiconductor substrate, and
   a third protective film which is provided on the third lower insulating film, and occludes hydrogen.

4. The semiconductor device according to claim 2, wherein
   the second conductivity type region has a region in which an impurity concentration becomes low in a direction from the active region toward the edge termination structure section.

5. The semiconductor device according to claim 4, wherein
   the first protective film provided in the edge termination structure section is electrically insulated from the active region.

6. The semiconductor device according to claim 5, further comprising:
   a first upper insulating film on the first protective film which is provided in the edge termination structure section.

7. The semiconductor device according to claim 5, wherein
the first protective film is integrally formed in the edge termination structure section.

8. The semiconductor device according to claim 7, wherein
the semiconductor substrate further comprises a step portion which has a sloped portion and a flat portion in the edge termination structure section,
the first protective film is provided covering a whole upper side of the semiconductor substrate which includes the step portion in the edge termination structure section.

9. The semiconductor device according to claim 3, wherein
the active region further comprises a contact portion which provides an electrical connection between the semiconductor substrate and the third protective film which is provided on the semiconductor substrate,
in the contact portion, the semiconductor substrate has at least a nickel silicide,
in the contact portion, the third protective film has at least a titanium carbide.

10. A semiconductor device comprising:
a semiconductor substrate which has an active region and an edge termination structure section which is provided around the active region,
a first lower insulating film which is provided on the edge termination structure section on the semiconductor substrate, and
a first protective film which is provided on the first lower insulating film, and is electrically insulated from the semiconductor substrate, and occludes hydrogen, wherein
the active region further comprises:
a third lower insulating film which is provided on the semiconductor substrate, and
a third protective film which is provided on the third lower insulating film, and occludes hydrogen, and
a thickness of the first protective film in the edge termination structure section is larger than a thickness of the third protective film in the active region.

11. A semiconductor device comprising:
a semiconductor substrate which has an active region and an edge termination structure section which is provided around the active region,
a first lower insulating film which is provided on the edge termination structure section on the semiconductor substrate, and
a first protective film which is provided on the first lower insulating film, and is electrically insulated from the semiconductor substrate, and occludes hydrogen, wherein
the active region further comprises:
a third lower insulating film which is provided on the semiconductor substrate, and
a third protective film which is provided on the third lower insulating film, and occludes hydrogen, and
a thickness of the third protective film in the active region is larger than a thickness of the first protective film in the edge termination structure section.

* * * * *